(12) United States Patent
Yoon et al.

(10) Patent No.: US 6,233,157 B1
(45) Date of Patent: May 15, 2001

(54) PRINTED CIRCUIT BOARD AND METHOD FOR WIRING SIGNAL LINES ON THE SAME

(75) Inventors: Yong Sik Yoon, Ich'on; Young Suk Suh, Kwach'on; Jung Woo Lee, Ich'on, all of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/223,285

(22) Filed: Dec. 30, 1998

(30) Foreign Application Priority Data

Nov. 7, 1998 (KR) .................................................. 98-47644

(51) Int. Cl.⁷ ...................................................... H05K 7/02
(52) U.S. Cl. .......................... 361/760; 361/683; 361/686; 361/783; 361/765; 174/250; 174/255; 174/260; 228/180.21
(58) Field of Search ..................................... 361/760, 788, 361/683, 686, 783, 820, 826, 807, 808, 810, 765, 767, 751; 134/250, 251, 253, 254, 255, 260; 228/180.21, 180.22

(56) References Cited

U.S. PATENT DOCUMENTS

| | | | |
|---|---|---|---|
| 5,272,664 | * 12/1993 | Alexander et al. | 365/52 |
| 5,319,602 | 6/1994 | Shishikura . | |
| 5,375,084 | * 12/1994 | Begun et al. | 365/63 |
| 5,512,783 | * 4/1996 | Wakefield et al. | 257/693 |
| 5,572,457 | 11/1996 | Michael . | |
| 5,875,136 | * 2/1999 | Hsuan et al. | 365/200 |
| 5,936,844 | * 8/1999 | Walton | 361/760 |
| 5,941,447 | * 8/1999 | Chu et al. | 228/180.21 |
| 5,959,937 | * 9/1999 | Randolph et al. | 365/233 |

FOREIGN PATENT DOCUMENTS 1-225388   9/1989   (JP) .

* cited by examiner

Primary Examiner—Jayprakash N. Gandhi
Assistant Examiner—David Foster
(74) Attorney, Agent, or Firm—Ladas & Parry (57) ABSTRACT

Disclosed are a printed circuit board and a method for wiring signal lines on the same. Connecting lines for electrically connecting chip select pins of a semiconductor chip, no connect pins and address designate pins, are formed on a PCB. In case of an unstack type, a pad is connected to chip select pin and no connect functioning pin of other semiconductor chip via a first signal line. In case of a stack type, another pad used with a pad is connected to a no connect functioning pin and a chip select pin of the corresponding semiconductor chip having no connection with the first signal line via a second signal line. According to the type of semiconductor chip, e.g. unstack or stack type, a second connecting pad selectively connecting by a first jumper having almost zero resistance value, is disposed between the first and the second signal lines. A first connecting pad is also disposed at the second signal line, the first pad is selectively connected by a second jumper having zero resistance value. Seven connecting pads are disposed on the PCB and an outer pad for transmitting an address signal is connected to three pads which are not disposed adjacently in series. Among the remained four connecting pads, three pads are connected to connecting lines connecting the respective pins of semiconductor chips by signal lines, and the rest is connected to a signal line by another signal line. According to the memory capacity of semiconductor chip, the spaces between the respective connecting pads are selectively connected by jumpers.

10 Claims, 6 Drawing Sheets

PRINTED CIRCUIT BOARD AND METHOD FOR WIRING SIGNAL LINES ON THE SAME

BACKGROUND OF THE INVENTION

Field of the Invention

The present invention relates to a printed circuit board, hereinafter "PCB" and a method for wiring signal lines on the same.

A plurality of semiconductor chips are mounted on a PCB and the PCB is mounted on a motherboard, thereby electrically connecting its pad to the motherboard.

When a chip select signal or an address signal is transmitted from the motherboard to the PCB, a corresponding semiconductor chip is selected or its address is designated. Accordingly, signal lines for transmitting a chip select signal and an address signal to each semiconductor chip are wired on the PCB. The signal lines vary as to what semiconductor chip is mounted on the PCB.

Namely, the signal lines vary as memory capacity of the semiconductor chip is 64M including 128M or 256M, and also vary as the type of semiconductor chip, e.g. an unstack type consisting of one chip by itself, or stack type consisting of a plurality of stacked chips.

First of all, four pads provided on the PCB are used as chip select signals, and each corresponding pad is connected to a chip select pin, typically a nineteenth pin (/cs). The four pads are named typically S0, S1, S2, and S3. Only two pads are used 4 chip selection in case that the semiconductor chip mounted on the PCB is the unstack type, and four pads are all used as chip selection in case that it is the stack type. The following Table 1 illustrates the fashion in particular.

TABLE 1

| Pad No. | S0 | S1 | S2 | S3 |
|---|---|---|---|---|
| unstack chip | use | nonuse | use | nonuse |
| stack chip | use | use | use | use |

As shown in Table 1, only pads S0 and S2 are used in the unstack type of the semiconductor chip, while four pads are all used in the stack type of that. Accordingly, in case of unstack type, the used pads S0 and S2 are connected to the nineteenth pin of the semiconductor chip via signal lines, and pads S1 and S3 are not connected to the nineteenth pin. On the other hand, in case of stack type, the four pads are all connected to the nineteenth pin of the semiconductor chip via signal lines. Thus, the wiring arrangement of signal lines varies as the semiconductor chip mounted on the PCB is the unstack type or the stack type.

In the meantime, the address signal is generally transmitted to a twentieth pin, a twenty-first pin and a thirty-sixth pin via pads on the PCB. The pins used for the address signal vary as the memory capacity of semiconductor chip is 64M or 128M on the one hand or 256 the other hand. The following Table 2 illustrates the fashion in particular.

TABLE 2

| Pin No. | 64M including 128M | 256M |
|---|---|---|
| 20 | A13 | A14 |
| 21 | A12 | A13 |
| 36 | NC | A12 |

As shown in Table 2, in case that the memory capacitance of the semiconductor chip is 64M, the address signal is transmitted to the twentieth pin via the pad A13, to the twenty-first pin via the pad A12, while the thirty-sixth pin is not connected to any pad. The word NC means "No Connect". In the meantime, in case of 256M, the address signal is transmitted to the twentieth pin via the pad A14, to the twenty-first pin via the pad A13 and to the thirty-sixth pin via the pad A12. Accordingly, the wiring arrangement of signal lines varies as the memory capacity of chip is 64M or 256M.

As described above, the wiring arrangements of signal lines on the PCB vary with the semiconductor chips to be mounted. That is, there are totally four cases of different wiring arrangement of signal lines that the semiconductor chip is unstack/64M or 128M, unstack/256M, stack/64M 128M, and stack/256M.

Therefore, it is conventionally required to have four PCBs having different wiring arrangements according to the four cases. Particularly, the PCB is made pursuant to each wiring arrangement, therefore it incurs lots of time-consuming jobs for developing appropriate module, testing the PCB or mass-producing and delivering products to production line.

SUMMARY OF THE INVENTION

Accordingly, the present invention is directed to solve the foregoing problems of conventional PCBs and to provide a method for wiring arrangement of signal lines and a PCB having convertibility with various types of semiconductor chip, e.g. unstack chip or stack chip and memory capacity of 64M or 256M without incurring additional design steps for wiring arrangement of signal lines.

So as to achieve the above object, the PCB in accordance with the present invention comprises as follows. Semiconductor chips having their peculiar functions are mounted on a PCB. Various signals from a motherboard where the PCB is mounted are selectively transmitted to each pin via outer pads of the PCB. A plurality of connecting lines are formed on the PCB for connecting the pins of the respective chips having same function each other. Each connecting line and its corresponding outer pad is connected via a plurality of signal lines so that each pin connected by the connecting lines is electrically connected to its corresponding outer pad. Connecting pads which are connectable electrically, are disposed at the plurality of signal lines or therebetween. The connecting pads are selectively connected via a jumper having resistance value of approximately 0(zero), depending on stacking or memory capacity of the semiconductor chip.

The wiring arrangement of signal lines will be described in detail according to peculiar function of pins on semiconductor chip.

An outer pad used in case that the semiconductor chip is unstack type, is connected to a chip select pin of one of two semiconductor chips disposed on both opposing sides of a PCB and is also connected to a no connect pin of the other semiconductor chip via a first signal line respectively.

Another pad used with the above pad in case that the semiconductor chip is stack type, is connected to a no connect pin of the semiconductor chip which of the chip select pin is connected to the above pad by the first signal line via a second signal line, and is also connected to a chip select pin of the semiconductor chip which of the no connect pin is connected to the above pad by the first signal line via a second signal line respectively.

A second connecting pad is disposed between the first and the second signal lines, and selectively connected by a first jump chip having resistance value of approximately 0 (zero), depending on the types of semiconductor chip, e.g. unstack/ stack type. A first connecting pad is disposed at the second signal line and is connected by a second jump chip.

Furthermore, connecting lines are formed on the PCB so that the respective three pins of semiconductor chips transmitted an address signal from the motherboard are connected with pins of the same number. Seven connecting pads are disposed on the PCB and a second, a fourth and a seventh connecting pads among the seven are electrically connected to outer pads for transmitting the address signal. A first, a third and a sixth pads are connected to the connecting lines connecting the respective pins of a semiconductor chip via three signal lines. A fifth pad is connected to the signal line extended to the sixth pad via another connecting line. The respective connecting pads are selectively connected by jump chips, depending on the memory capacitance of semiconductor chip.

According to the above constitution of the present invention, there is no need to design wiring arrangement on the PCB, depending on the types of semiconductor chip, e.g. unstack/stack or memory capacity of 64M or 256M, since the corresponding connecting pads are selectively connected by jumpers.

Hereinafter, the best mode for carrying out the present invention will be described more fully below with reference to attached drawings.

DETAILED DESCRIPTION OF THE PREFERRED EMBODIMENTS

Firstly, a PCB is given in this embodiment for explanatory convenience in that nine semiconductor chips C mounted on the PCB are disposed on both opposing sides of the PCB respectively, and the PCB is divided into four regions which are defined by position and connection of the semiconductor chips C. In the mean time, FIGS. 1 and 2 are plane views of semiconductor chips mounted on the PCB for explanatory convenience.

Figure 1:
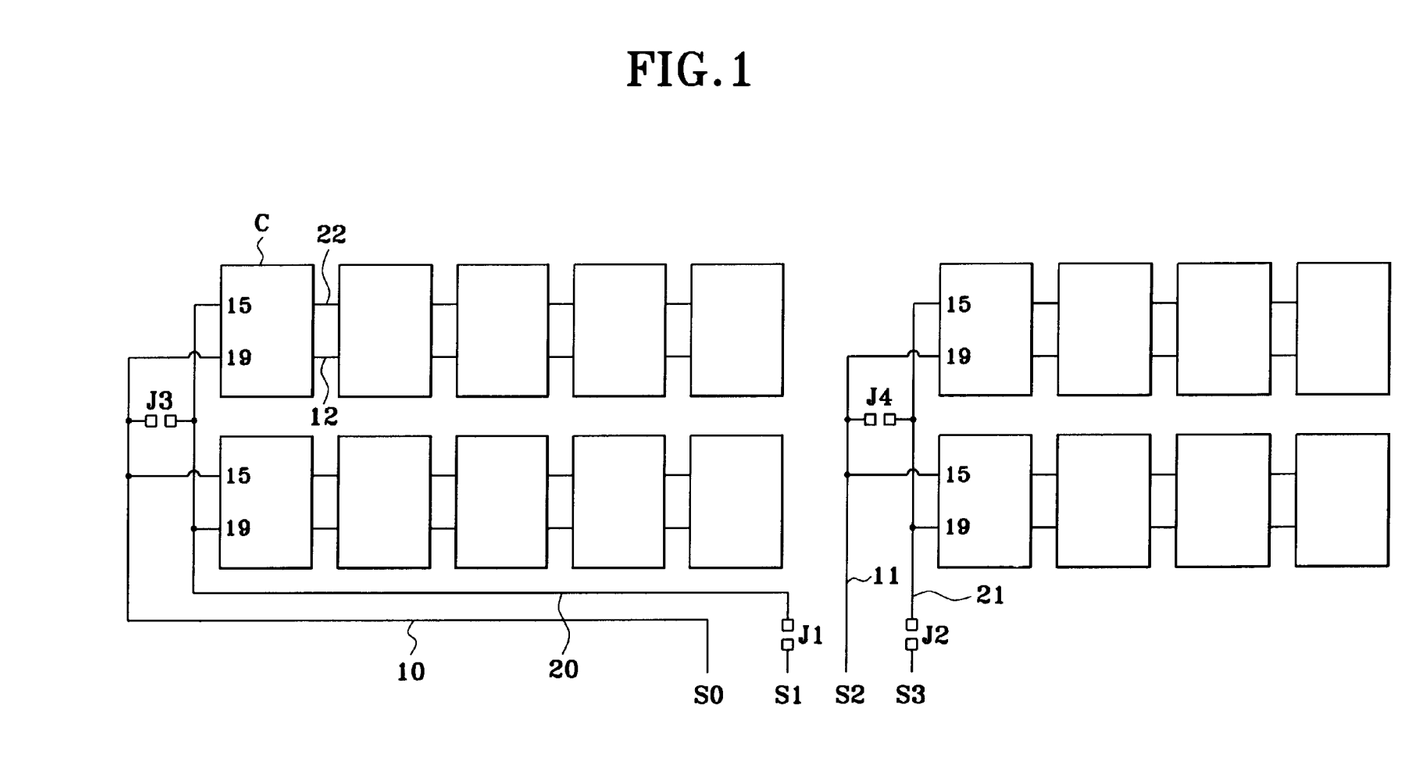
FIG. 1 shows a wiring arrangement of chip select signal in a PCB in accordance with the present invention.
Figure 2:
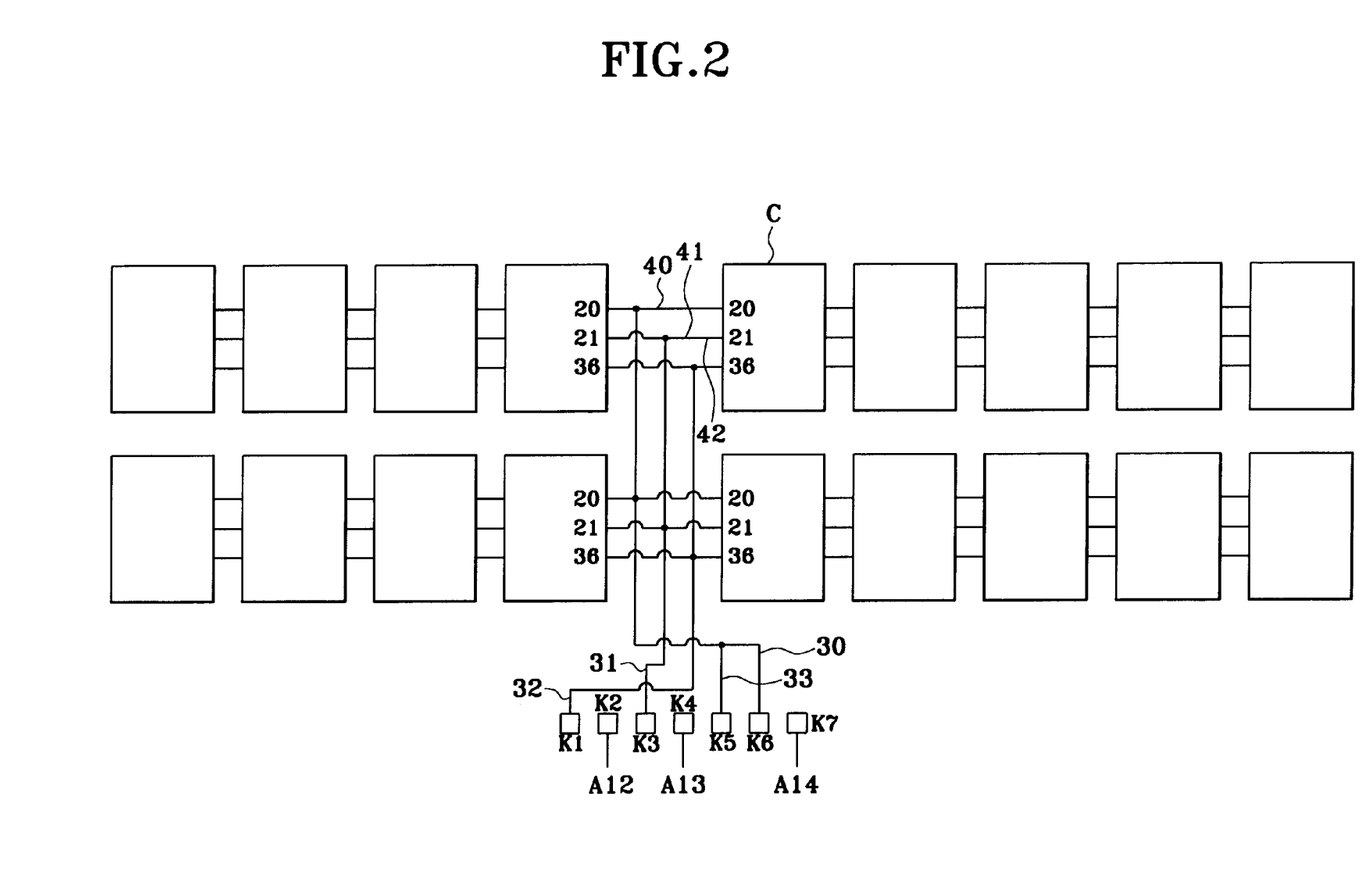
FIG. 2 shows a wiring arrangement of address signal in a PCB in accordance with the present invention.

Referring to FIG. 1, the semiconductor chips C are disposed on the four regions of the PCB; left two regions of five ups and five downs, and right two regions of four ups and four downs, so that the PCB is divided into the four regions.

Consequently, the PCB requires four outer pads to which a chip select signal is transmitted from a motherboard on which the PCB is mounted. The respective pads are typically named as S0, S1, S2 and S3. As shown in above Table 1, only the pads S0 and S2 are used as the unstack type and the pads S1 and S3 are not used while all pads are used in the stack type.

In the meantime, semiconductor chips C include a plurality of pins having their particular functions, typically 54 pins; a pin 19 for selecting chip, no connect pin 15 and 36 which are not electrically connected to the outer pads and pins 20 and 21 for designating chip address. When the semiconductor chip C of 256M memory capacity is mounted on the PCB, the pin 36 is used as an address designating pin together with pins 20 and 21. As shown in FIGS. 1 and 2, connecting lines 12, 22, 40, 41 and 42 are formed on the PCB, i.e. between the semiconductor chips C so that the pins of the same number of semiconductor chips disposed on the same region are electrically connected to each other when semiconductor chips C are mounted on the PCB.

One end of a first signal line 10 is connected to the pad S0 which is used in case of unstack type, and the other end of the first signal line 10 is diverged in two parts; one is connected to the chip select pin 19 of left upper semiconductor chips and the other is connected to the no connect pin 15 of left lower semiconductor chips. The pad S2 used with the pad S0 in case that the semiconductor chip is unstack type, is connected to the chip select pin 15 and the no connect pin 19 of right semiconductor chips via the third signal line 11 having the same arrangement of the first signal line 10.

One end of a second signal line 20 is connected to the pad S1 which is used in case of stack type, and the other end of the second signal line 20 is diverged in two parts; one is connected to the no connect pin 15 of left upper semiconductor chips and the other is connected to the chip select pin 19 of left lower semiconductor chips. Namely, the second signal line 20 is connected to pins which are not connected to the first signal line 10. On the other hand, the pad S3 similarly used as the pad S1, is connected to the no connect pin 19 and the chip select pin 15 via the fourth signal line 21 having the same arrangement of the second signal line 20.

A first and a second connecting pads J1 and J2 for selecting chip being connectable electrically are disposed at the second and the fourth signal lines 20 and 21 so that the respective signal lines 20 and 21 are not sequentially continued. A third connecting pad J3 for selecting chip is disposed behind portion of the divergence position of the first and the second signal lines 10 and 20. A fourth connecting pad J4 is disposed behind portion of the divergence position of the third and the fourth signal lines 11 and 21. As shown in FIGS. 3 to 6, the respective connecting pads J1 to J4 are selectively connected via a jumper R having resistance value of approximately 0 (zero) Ω according to unstack/stack type of the semiconductor chip C. Here the jump chip R is made of a conductible material having almost no resistance value, and is a kind of mean for switching.

A wiring arrangement to which a chip select signal is selectively transmitted according to unstack/stack type has been described above. Another wiring arrangement to which an address signal is selectively transmitted according to memory capacity of semiconductor chip will be described below with reference to FIG. 2.

As shown in the drawings, seven connecting pads K1, K2, K3, K4, K5, K6 and K7 for designating address are disposed on the PCB. An address signal from the motherboard is transmitted to address designate pins 20, 21 and 36 of semiconductor chip C via outer pads A12, A13 and A14 of the PCB. Accordingly, three pads among the seven connecting pads are connected to the outer pads A12, A13 and A14. Namely, the second connecting pad K2 is connected to the outer pad 12, the fourth connecting pad K4 to the outer pad A13 and the seventh connecting pad K7 to the outer pad A14. In the mean time, the sixth connecting pad K6 is connected to a connecting line 40 which connects pins 20 of the respective semiconductor chips C via the fifth signal line 30. The third connecting pad K3 is connected to a connecting line 41 which connects pins 21 of the respective semiconductor chips C via the sixth signal line 31. The first connecting pad K1 is connected to a connecting line 42 which connects pins 36 of the respective semiconductor chips C via the seventh signal line 32. Finally, the fifth connecting pad K5 is connected to the fifth signal line 30 via the eighth signal line 33. The respective connecting pads K1, K2, K3, K4, K5, K6 and K7 are selectively connected by the jumpers, depending on the memory capacity of the semiconductor chips, e.g. 64M including 128M or 256M.

On the other hand, while this embodiment shows wiring arrangement for connecting only the outer pad A12 to the second connecting pad K2, A13 to the fourth connecting pad K4 and A14 to the seventh connecting pad K7, however, it is not limited in the fashion. For instance, the A12 to the first connecting pad K1, A13 to the third connecting pad K3, A14 to the sixth connecting pad K6 and the signal lines to the connecting pads K2, K4 and K7 can be connected. Namely, the adjacent connecting pads should be selectively connected by the jumper R, therefore the outer pads are optionally connected to connecting pads which are not disposed adjacently in series and the signal wiring arrangements are changed accordingly.

Four cases of different wiring arrangement of signal lines that the memory capacities 64M and 256M are given to both unstack chip and stack type, are available according to the above arrangements. Hereinafter, detailed description on each case will be followed with reference to FIGS. 3 to 6.

Figure 3:
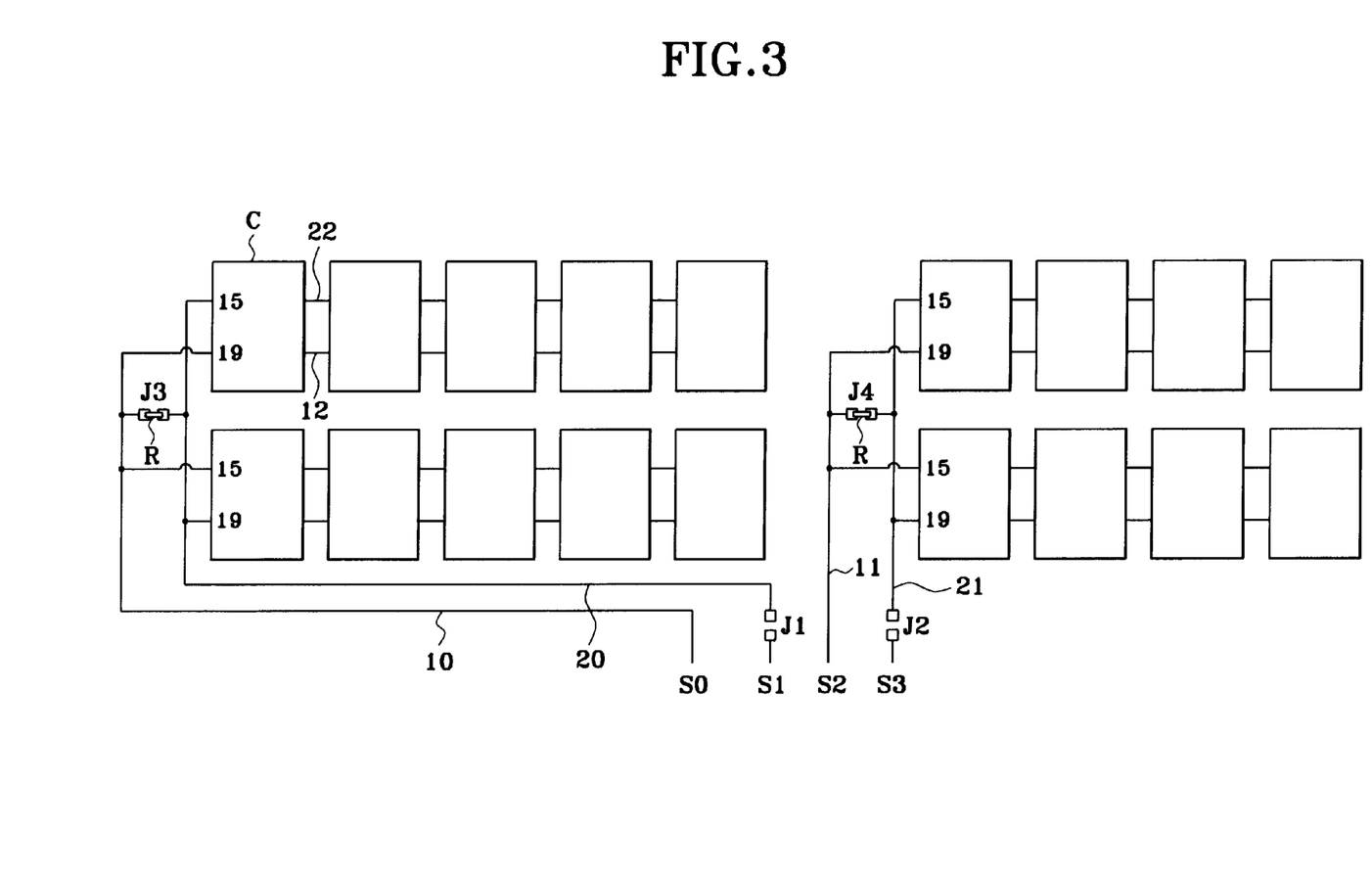
FIG. 3 shows the connecting state of connecting pads by jumpers when the chip is an unstack type.

FIG. 3 shows the connecting state of connecting pads by the jumper when the chip is a unstack type. As shown, pads S0 and S2 are only used and the pads S1 and S3 are not used in case of unstack type. So the first and the second connecting pads J1 and J2 are open, not connected to the jumper R while the third and the fourth connecting pads J3 and J4 are connected by the jumper R.

Consequently, the chip select signal from the motherboard is not transmitted via the pads S1 and S3, but transmitted via the pads S0 and S2 only. That means, the chip select signal is transmitted to the pins 19 and 15 of the opposing semiconductor chips C via the first and the third signal lines 10 and 11. Further, the chip select signal is transmitted to the second and the fourth signal lines 20 and 21 via the third and the fourth connecting pads J3 and J4 which are connected by the jump chip, and also is transmitted to the other pins 15 and 19 of the opposing semiconductor chips C.

Figure 4:
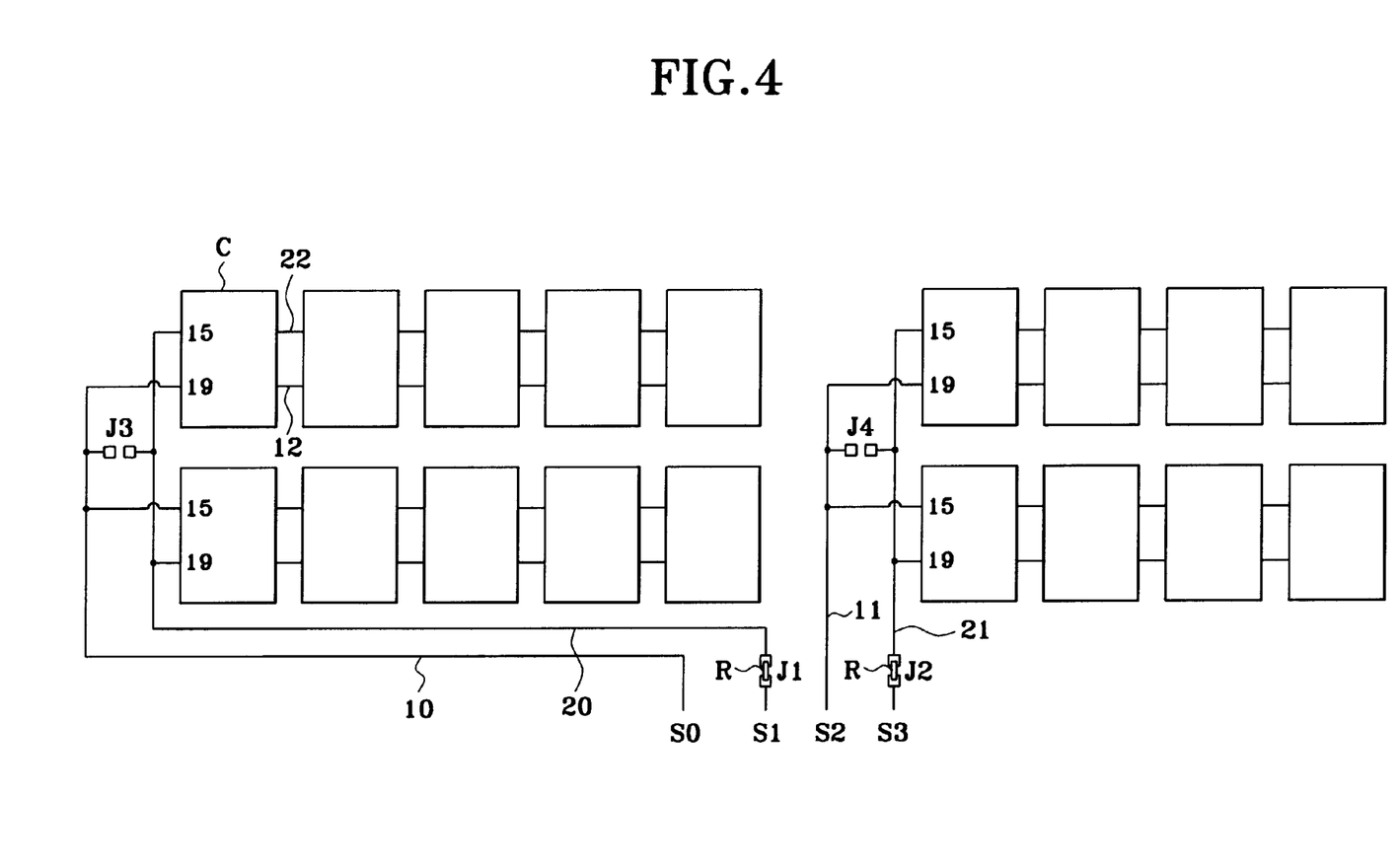
FIG. 4 shows the connecting state of connecting pads by jumpers when the chip is a stack chip.

In the mean time, all pads S0, S1, S2 and S3 are used in case of stack type as shown in FIG. 4. In contrast to FIG. 3, the third and the fourth connecting pads J3 and J4 are open, while the first and the second connecting pads J1 and J2 are connected by the jump chip R.

Consequently, the chip select signal through the pads S0 and S2 is transmitted to the pins 19 and 15 of the semiconductor chips C via the first and the third signal lines 10 and 11. But the chip select signal is not transmitted to the second and the fourth signal lines 20 and 21 since the third and the fourth connecting pads are open. While the chip select signal through the outer pad S1 and S3 is transmitted to the other pins 15 and 19 of the semiconductor chips C via the second and the fourth signal lines 20 and 21.

Figure 5:
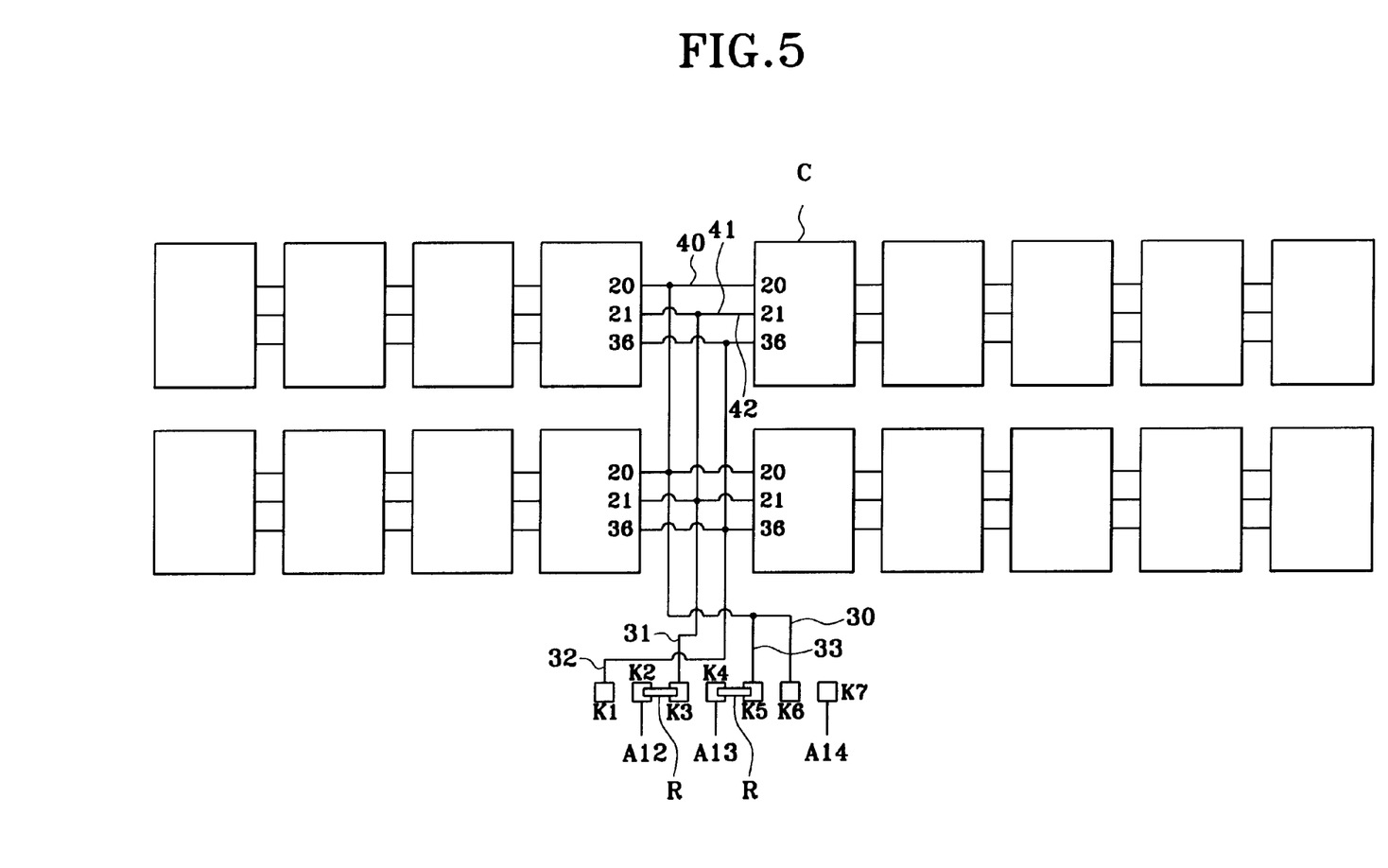
FIG. 5 shows the connecting state of connecting pads by jumpers when capacity of the chip is 64M.

Next, FIG. 5 shows an address signal transmitting path in case the memory capacity of semiconductor chip is 64M. The address signal is transmitted only to pins 20 and 21 of the semiconductor chip C, and the address signal is not transmitted to the pin 36. Therefore the second connecting pad K2 and the third connecting pad K3 are connected by the jumper R and the fourth connecting pad K4 and the fifth connecting pad K5 are also connected by the jumper R.

Consequently, the address signal through the outer pad A13 is transmitted to an eighth signal line 33 via the fourth and the fifth connecting pads K4 and K5 and next, the address signal is transmitted to a connecting line 40 which connects pins 20 of the respective semiconductor chips C via the fifth signal 30 and finally the address signal is transmitted to the pins 20 of the respective semiconductor chips C. Furthermore, the address signal through the outer pad A12 is transmitted to a connecting line 41 which connects pins 21 of the respective semiconductor chips C, via the second and the third connecting pads K2 and K3, and the sixth signal line 31. In the mean time, the address signal through the outer pad A14 is not transmitted to pins of semiconductor chips since no signal line is connected to the outer pad A14.

Figure 6:
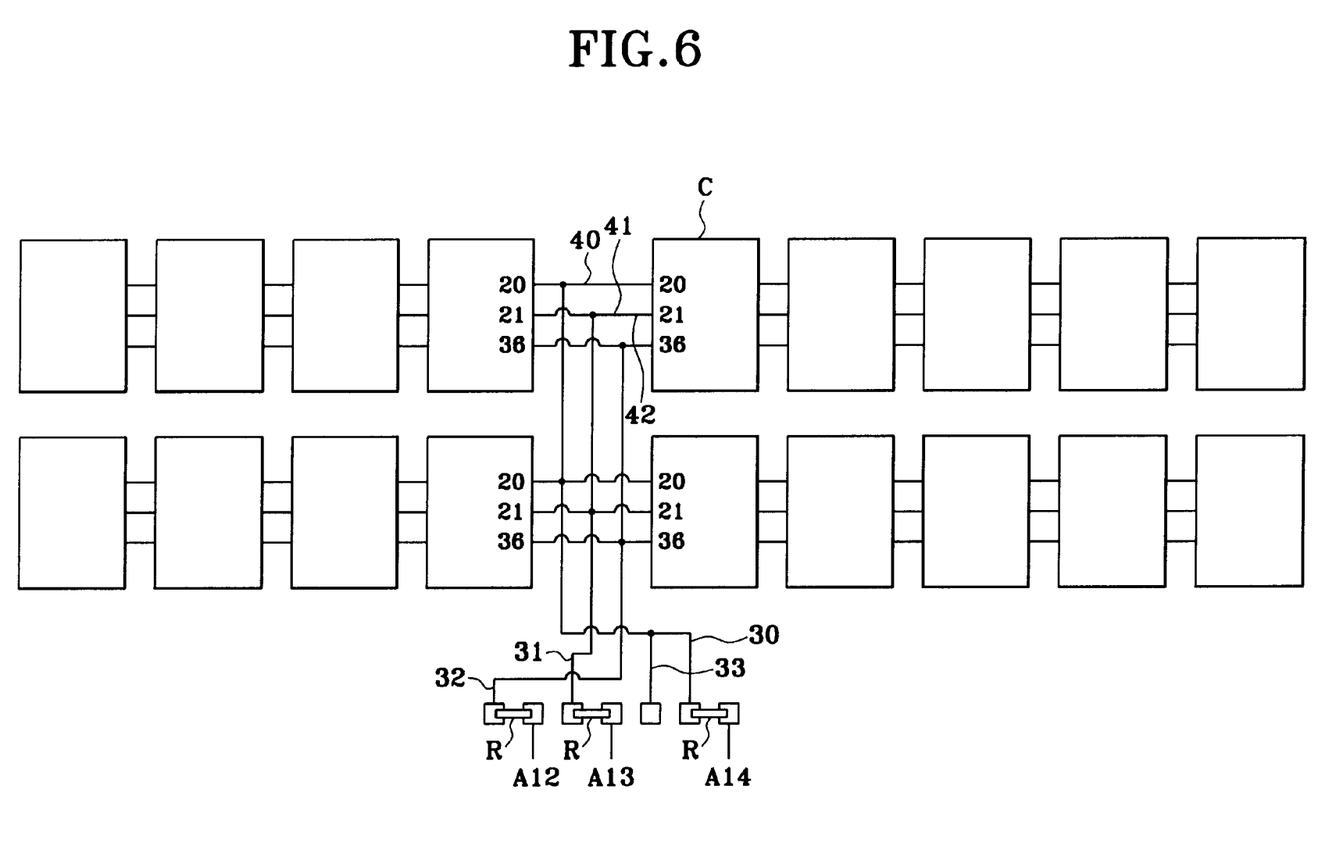
FIG. 6 shows the connecting state of connecting pads by jumpers when capacity of the chip is 256M.

Finally, FIG. 6 shows an address signal transmitting path in case of the memory capacity of a semiconductor chip of 256M. The respective connecting pads; the first and the second K1 and K2, the third and the fourth K3 and K4, and the sixth and the seventh K6 and K7 are connected by the jumpers R so as to connect the outer pad A14 to the pin 20, the outer pad A13 to the pin 21 and the outer pad A12 to the pin 36.

Accordingly, the address signal through the outer pad A14 is transmitted to the pin 20 via the seventh, the sixth connecting pad K7 and K6, and the fifth signal line 30. The address signal through the outer pad A13 is transmitted to the pin 21 via the fourth, the third connecting pads K4 and K3, and the sixth signal line 31. Further, the address signal through the outer pad A12 is transmitted to the pin 36 via the second, the first connecting pad K2 and K1, and the seventh signal line 32.

Therefore, a designer of the wiring arrangement may simply design the arrangement based on FIGS. 1 and 2, and can connect the connecting pads selectively according to the types of semiconductor chips; FIG. 3 in case of unstack type; FIG. 4 in case of stack type; FIG. 5 in case of memory capacity of 64M; and FIG. 6 in case of memory capacity of 256M. One PCB is applicable to four types of semiconductor chips mounted thereon.

As described above, this invention remarkably reduces unit price of modules since this invention employs one PCB capable of applying four types of semiconductor chips, instead of employing four PCBs.

Specifically, this invention shortens development time and those procedures from development request to mass-production.

Therefore, it will be understood by those skilled in the art that various changes in form and details may be made therein without departing from the spirit and the scope of the invention as defined by the following claims.

What is claimed is:

1. A method of wiring signal lines on a printed circuit board (PCB) to transmit various signal from outer pads the PCB to respective pins of semiconductor chips mounted on the PCB wherein the pins have particular functions that include chip selection, no connection and address designation, comprising the steps of:

forming connecting lines on the PCB for electrically connecting the respective pins, of the semiconductor chips, having same function; connecting between the connecting lines and the outer pads corresponding to the respective connecting lines by a plurality of signal lines; and disposing electrically connectable connecting pads on the signal lines.

2. The method as claimed in claim 1, wherein the connecting pads are connected by jumpers having resistance values approximately zero according to memory capacity or whether the semiconductor chips are stackable or unstackable.

3. The method as claimed in claim 2, wherein in case the semiconductor chips are unstack type, one end of a first signal line is connected to one of the outer pads which is transmitted the chip select signal, another end of the first signal line is diverged in two, the diverged one end of the first signal line is connected to a chip select pin of a semiconductor chip, and the diverged another end of the first signal line is connected to the no connect pin of other semiconductor chip;

in case the semiconductor chips are stack type, one end of a second signal line is connected to the rest outer pad to which is transmitted the chip select signal, wherein the chip select signal is also transmitted to the outer pad, another end of the second signal line is diverged in two, the diverged one end of the second signal line is connected to the no connect pin of the semiconductor chip which of the chip select pin is connected to the diverged one end of the first signal line, and the diverged another end of the second signal line is connected to the chip select pin of the other semiconductor chip;

the connecting pads are disposed on portions of the first and the second signal lines which are behind divergence position of the first and the second signal lines, and also the other connecting pad is disposed on the second signal line; and the respective connecting pads are selectively connected by the jumpers according to unstack or stack type of the semiconductor chips.

4. The method as claimed in claim 2, wherein seven connecting pads are disposed on the PCB for transmitting the address signals selectively to the two address designate pins and another no connect pin not for selecting chip according to the memory capacity of the semiconductor chips;

the three outer pads transmitted the address signal are connected to three of the seven connecting pads which are not disposed adjacently in series, three of the rest four connecting pads are separately connected to the connecting lines which connect the address designate pin and the no connect pin, and the remained connecting pad is connected to one of the three signal lines; and two of the above seven connecting pads which are disposed adjacently are selectively connected by the jumpers according to memory capacitance of the semiconductor chips.

5. The method as claimed in claim 2, wherein in case the semiconductor chips are unstack type, one end of a first signal line is connected to one of the outer pads which is transmitted the chip select signal, another end of the first signal line is diverged in two, the diverged one end of the first signal line is connected to a chip select pin of a semiconductor chip, and the diverged another end of the first signal line is connected to the no connect pin of other semiconductor chip;

in case the semiconductor chips are stack type, one end of a second signal line is connected to the rest outer pad to which is transmitted the chip select signal, wherein the chip select signal is also transmitted to the outer pad, another end of the second signal line is diverged in two, the diverged one end of the second signal line is connected to the no connect pin of the semiconductor chip which of the chip select pin is connected to the diverged one end of the first signal line, and the diverged another end of the second signal line is connected to the chip select pin of the other semiconductor chip;

the connecting pads are disposed on portions of the first and the second signal lines which are behind divergence position of the first and the second signal lines, and also the other connecting pad is disposed on the second signal line;

the respective connecting pads are selectively connected by the jumpers according to unstack or stack type of the semiconductor chips;

seven connecting pads are disposed on the PCB for transmitting the address signals selectively to the two address pins and another no connect pin not for selecting chip according to the memory capacitance of the semiconductor chips;

the three outer pads transmitted the address signal are connected to three of the seven connecting pads which are not disposed adjacently in series, three of the rest four connecting pads are separately connected to the connecting lines which connect the address designate pin and the no connect pin, and the remained connecting pad is connected to one of the three signal lines; and two of the above seven connecting pads which are disposed adjacently are selectively connected by the jump chips according to memory capacitance of the semiconductor chips.

6. A Printed Circuit Board (PCB) having a plurality of semiconductor chips mounted thereon which is provided with pins having the functions of chip selection, no connection and address designation, and having outer pads corresponding to the functions, comprising:

connecting lines formed on the PCB for electrically connecting the respective pins, of the semiconductor chips, having the same functions;

signal lines connected between the connecting lines and the outer pads corresponding to the respective connecting lines; and electrically connectable connecting pads disposed on the signal lines.

7. The PCB as claimed in claim 6, wherein the connecting pads are connected by jumpers having resistance values approximately zero according to memory capacities or whether the semiconductor chips are stackable or unstackable.

8. The PCB as claimed in claim 7, wherein in case the semiconductor chips are unstack type, one end of a first signal line is connected to one of the outer pads which is transmitted the chip select signal, another end of the first signal line is diverged in two, the diverged one end of the first signal line is connected to a chip select pin of a semiconductor chip, and the diverged another end of the first signal line is connected to the no connect pin of other semiconductor chip;

in case the semiconductor chips are stack type, one end of a second signal line is connected to the rest outer pad to which is transmitted the chip select signal, wherein the chip select signal is also transmitted to the outer pad, another end of the second signal line is diverged in two, the diverged one end of the second signal line is connected to the no connect pin of the semiconductor chip which of the chip select pin is connected to the diverged one end of the first signal line, and the diverged another end of the second signal line is connected to the chip select pin of the other semiconductor chip;

the connecting pads are disposed on portions of the first and the second signal lines which are behind divergence position of the first and the second signal lines, and also the other connecting pad is disposed on the second signal line; and the respective connecting pads are selectively connected by the jumpers according to unstack or stack type of the semiconductor chips.

9. The PCB as claimed in claim 7, wherein seven connecting pads are disposed on the PCB for transmitting the address signals selectively to the two address pins and another no connect pin not for selecting chip according to the memory capacity of the semiconductor chips;

the three outer pads transmitted the address signal are connected to three of the seven connecting pads which are not disposed adjacently in series, three of the rest four connecting pads are separately connected to the connecting lines which connect the address designate pin and the no connect pin, and the remained connecting pad is connected to one of the three signal lines; and two of the above seven connecting pads which are disposed adjacently are selectively connected by the jump chips according to memory capacitance of the semiconductor chips.

10. The PCB as claimed in claim 7, wherein in case the semiconductor chips are unstack type, one end of a first signal line is connected to one of the outer pads which is transmitted the chip select signal, another end of the first signal line is diverged in two, the diverged one end of the first signal line is connected to a chip select pin of a semiconductor chip, and the diverged another end of the first signal line is connected to the no connect pin of other semiconductor chip;

in case the semiconductor chips are stack type, one end of a second signal line is connected to the rest outer pad to which is transmitted the chip select signal, wherein the chip select signal is also transmitted to the outer pad, another end of the second signal line is diverged in two, the diverged one end of the second signal line is connected to the no connect pin of the semiconductor chip which of the chip select pin is connected to the diverged one end of the first signal line, and the diverged another end of the second signal line is connected to the chip select pin of the other semiconductor chip;

the connecting pads are disposed on portions of the first and the second signal lines which are behind divergence position of the first and the second signal lines, and also the other connecting pad is disposed on the second signal line;

the respective connecting pads are selectively connected by the jumpers according to unstack or stack type of the semiconductor chips;

seven connecting pads are disposed on the PCB for transmitting the address signals selectively to the two address pins and another no connect pin not for selecting chip according to the memory capacity of the semiconductor chips;

the three outer pads transmitted the address signal are connected to three of the seven connecting pads which are not disposed adjacently in series, three of the rest four connecting pads are separately connected to the connecting lines which connect the address designate pin and the no connect pin, and the remained connecting pad is connected to one of the three signal lines; and two of the above seven connecting pads which are disposed adjacently are selectively connected by the jumpers according to memory capacity of the semiconductor chips.

* * * * *